(12) United States Patent
Bula et al.

(10) Patent No.: US 6,214,494 B1
(45) Date of Patent: *Apr. 10, 2001

(54) SERIF MASK DESIGN METHODOLOGY BASED ON ENHANCING HIGH SPATIAL FREQUENCY CONTRIBUTION FOR IMPROVED PRINTABILITY

(75) Inventors: Orest Bula, Shelburne; Daniel Cole, Jericho; Edward Conrad, Jeffersonville; Ning Lu, Essex Junction, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,948

(22) Filed: Oct. 7, 1998

(51) Int. Cl.[7] .................................................. G03F 9/00
(52) U.S. Cl. ................................ 430/5; 430/30; 430/302
(58) Field of Search .............................. 430/5, 30, 296, 430/302

(56) References Cited

U.S. PATENT DOCUMENTS

| 5,242,770 | 9/1993 | Chen et al. ........................ 430/5 |
| 5,340,700 | 8/1994 | Chen et al. ........................ 430/312 |
| 5,663,893 | 9/1997 | Wampler et al. .................. 364/491 |
| 5,879,844 | * 3/1999 | Yamamoto et al. ............... 430/296 |

FOREIGN PATENT DOCUMENTS 8-101491  4/1996  (JP).

* cited by examiner

Primary Examiner—Christopher G. Young
(74) Attorney, Agent, or Firm—Scully, Scott, Murphy & Presser; William D. Sabo, Esq.

(57) ABSTRACT

A proximity correction serif design methodology is described that provides improved inner and outer corner rounding, line end shortening, as well as improvements in more general undesirable two-dimensional shape distortions introduced into the lithographic printing process due to proximity effects. Using this method, exact solutions are shown for the specialized cases of either coherent or incoherent illumination exposing a hypothetical resist that develops via a simple diffusion like mechanism. The basis of this method for predicting the positions and shapes of serifs is tied to the need to increase the components of high spatial frequency that are essentially lost due to diffraction, diffusion, dissolution, and etching related effects. The correct amount to increase the spatial components is determined in the coordinate space and makes use of an empirical characterization of these physical factors.

22 Claims, 8 Drawing Sheets

SERIF MASK DESIGN METHODOLOGY BASED ON ENHANCING HIGH SPATIAL FREQUENCY CONTRIBUTION FOR IMPROVED PRINTABILITY

BACKGROUND OF THE INVENTION

This invention generally relates to methods for designing serif masks for photolithography.

Photolithography is the technology of reproducing patterns using light. As presently used within semiconductor technology, a mask pattern for a desired circuit is transferred to a wafer through light exposure, development, etch, and resist strip, etc. As the feature size on a circuit becomes smaller and smaller, the circuit shape on the wafer differs from the original mask pattern more and more. This effect is due to local and far-range proximity effects, including diffraction, exposure, baking, dissolution and etching factors. In particular, corner rounding, line end foreshortening and width changes of lines are typically observed, resulting in, for example, nested lines printing differently from isolated ones.

A key reason for optical proximity effects is due to light diffraction. Optical proximity effects coming from light diffraction can be overcome partly if one has the choice of using a shorter wavelength source of light, with a projection system possessing a larger numerical aperture. In practice, the wavelength of an optical light source is typically fixed (365 nm, 248 nm, 193 nm, etc.) and there is a practical upper limit on numerical aperture. So other resolution enhancement methods, including the use of phase-shifting masks and masks with serifs, have been developed to correct optical proximity effects.

SUMMARY OF THE INVENTION

An object of this invention is to provide a new method for arriving at a serif design that may be used to correct corner rounding and line end foreshortening, as well as more general undesirable two-dimensional shape distortions introduced into the lithographic printing process due to proximity effects. Another object of this invention is to provide specific new serif designs for correcting both corner rounding and line end shortening.

These and other objectives are attained with, a method for designing a mask for photolithography. The general technique described will be illustrated here in particular for the case of a rectilinear lithographic mask used in an optical projection system to create an image of the mask onto another structure, such as in the photoresist on a semiconductor wafer. (The general method that will be described, however, applies to general mask patterns, rather than just rectilinear ones, and it holds for including other physical effects of the other critical steps in the lithographic process (e.g., baking, dissolution, etching), being limited only in the accuracy of the convolution function for modeling the entire lithographic process.) Due to physical limitations of the optical projection system (e.g., numerical aperture less than unity and large wavelength of the optical source of light in relation to the pattern feature size), the image of the mask can have considerable distortion with respect to the mask pattern itself. As will be described, in accordance with this invention, a serif design can be added to each of the corners of a rectilinear mask pattern to compensate for the distortions of the lithographic printing process. For outside corners, such as in the corner of a rectangle, each serif design will be shown to lie completely outside the rectilinear mask and to be connected to the mask only at one of the corners. Similarly, for inside corners, such as in an "L" shaped structure, the optimal serif structure will be shown to lie inside the rectilinear pattern. The method described here applies to far more general conditions, but these are important specific structures that help to illustrate the method, and which can provide key leverage in improving printability in current microlithographic semiconductor technology.

Examples of specific serif designs that aid in the printability of rectilinear reticle structures are: a square, a rectangle, a quarter circle, a triangle and a polygon. For outside corners on a rectilinear structure, each serif design will normally be connected to, and outside the extension lines of, a respective one of the corners of the rectilinear structure. (If two outside corners are close enough together, then this may not be true, in which case the general method described here would need to be worked through to determine the optimum serif design.)

The method that will be described here can be proven to work exactly in the case of perfectly coherent light illumination, or the other extreme case of incoherent light illumination, combined with resist and etch developed properties that arise from a process that is entirely a convolution based mechanism. This method can be shown to hold approximately in the case of partially coherent light illumination and for resist and etch processes that involve more than a simple convolution based mechanism.

The advantage with these methods is that totally nonintuitive serif structures can be generated that significantly aid printability for the above ideal cases and less so, but still significantly, for the other situations. A very difficult aspect of making use of serif structures, as well as phase shift mask supporting structures, is in constructing the basis for the designs. This method significantly helps to solve this problem.

The size, shape, and placement of these serifs will be a function of the desired printed pattern, the allowed transmission values in the mask making process (e.g. whether chrome on glass is used, so only 1's and 0's are allowed, or more generally for PSM masks where transmission values ranging between −1 and +1 are allowed), and the convolution function, particularly its range, that characterizes the optical image and exposure process, the resist development process, and subsequent etching processes. By saying it this way, things like the numerical aperture, the wavelength, the partial coherence, the diffusion steps in the baking of the resist (temperature and baking duration), the dissolution of the resist, and physical factors governing the etching of underlying semiconductor structures, all in a sense become factors that govern the determination of the serifs, at least within the limitations of this convolution modeling process. More specifically, the convolution function does not separately identify each of these factors, but rather they all influence the type of function and its size parameters, as the convolution function becomes a phenomenological model, empirically determined, that describes the entire printing process. Again, we know that this model works perfectly in certain idealized cases, as described in the earlier sections, and according to our simulation work, it will provide considerable benefit under more general circumstances.

Further benefits and advantages of the invention will become apparent from a consideration of the following detailed description given with reference to the accompanying drawings, which specify and show preferred embodiments of the invention.

DETAILED DESCRIPTION OF THE PREFERRED EMBODIMENTS

Figure 1:
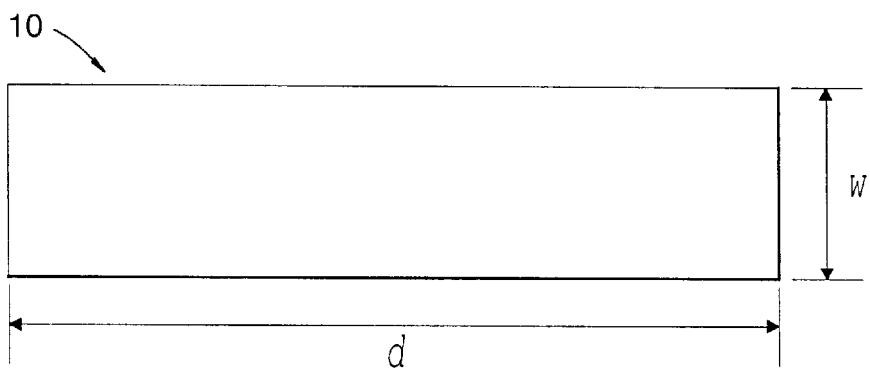
FIG. 1 shows a mask pattern used to form a rectangular reticle opening.
Figure 2:
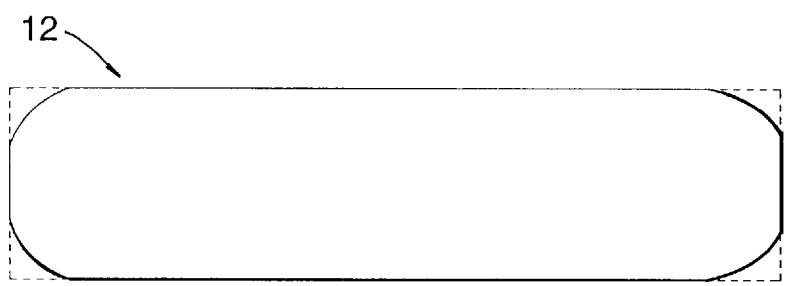
FIGS. 2 and 3, respectively, show corner rounding and line end shortening that may be printed in photoresist when the mask pattern of FIG. 1 is used.
Figure 3:
Figure 4:
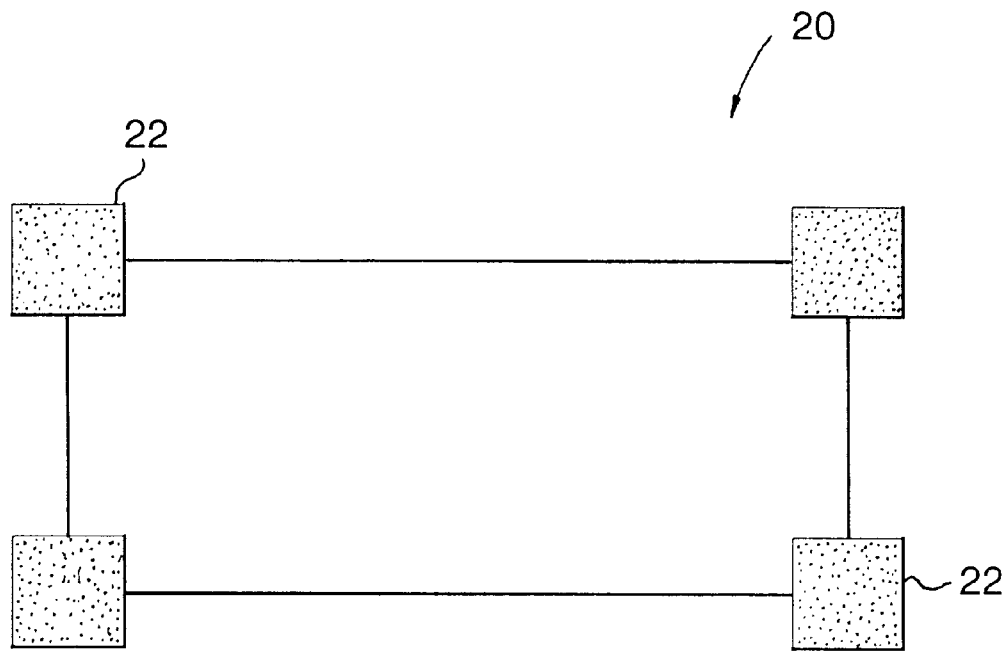
FIG. 4 illustrates a prior art serif design for correcting the corner rounding.
Figure 5:
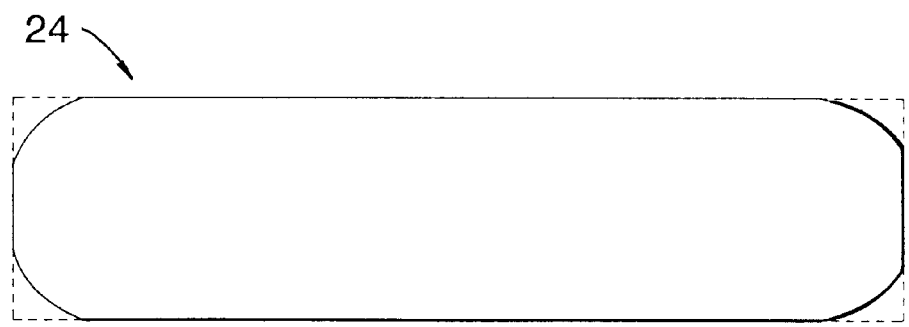
FIG. 5 shows a resist pattern made using the serif design of FIG. 4.

FIG. 1 illustrates a rectangular mask pattern that is often used in constructing microchip circuit shapes. The corner rounding and line end shortening make the pattern on a wafer look like the patterns shown at 12 and 14 in FIGS. 2 and 3 respectively. For correction, previous serif designs typically used have been designs like the design shown at 20 in FIG. 4. The key ingredient is that the serif is a small square or rectangle 22 overlapped at the corner of the original mask pattern to compensate the corner rounding caused by the light diffraction. FIG. 5 shows at 24 a resist pattern made using the serif design of FIG. 4.

The general method that will be described here shortly for deducing optimum serif designs will first be illustrated by discussing a number of specific novel serif designs that result from applying this general procedure. For example, one set of serif designs of this invention consists of a small shape hanging just outside both extension lines of a corner. The small shape can be a small squarr, a small rectangle, a small ¼ circle, a small triangle, or, in general, yet more complicated serif shapes. This new design was found using the method, discussed below, for enhancing high spatial frequency contributions in the proper way to improve printability.

With reference to FIG. 1, a rectangular shaped pattern of length d and width w can be represented by a 2D mask function called M(x, y; 0, d, 0, w), which hans value 1 for the 2D region of $0 \leq x \leq d$, $0 \leq y \leq w$, and value 0 for the rest of regions. This 2D function can be decomposed into the product of 2 1D window functions, M(x, y;0, d, 0, w)=m(x; 0, d)m(y; 0, w) where m(x; 0, d) is a one dimensional function which is 1 when $0 \leq x \leq d$ and zero elsewhere, as illustrated by the dashed line in FIG. 6. The dashed line represents a cut taken through the mask. Ideally, one typically wants to reproduce this mask structure as accurately as possible in the photoresist structure. However, imaging and photoresist processing effects (e.g., exposure, diffusion, dissolution) typically degrade microlithographic reproduction capabilities, resulting in a structure in the photoresist that looks something like the dash-dot line in FIG. 6.

Figure 6:
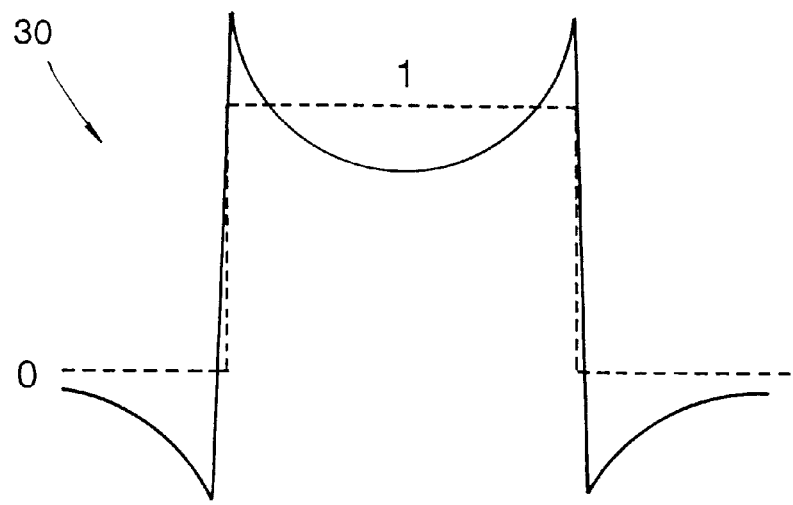
FIG. 6 illustrates a one-dimensional mask transmission function and a modified one-dimensional mask transmission function to increase the high spatial frequency contributions. Also shown is a (dash-dot curve that represents the image of the original mask transmission function.

The key idea of the present invention is to change the mask structure to compensate for this degradation in the printing process, by increasing the components of high spatial frequency that are typically lost in the imaging, photoresist and subsequent etching process steps. The two 1D widow functions in FIG. 6 are replaced by two modified 1D window functions s(x;0,d) and s(y;0,w) as illustrated in FIG. 6 by the solid curve. If this transmission curve could be constructed (it cannot, since the maximum magnitude of transmission is unity), then in principle it could be perfectly corrected for the degradations in the printing process to yield the desired printed structure. Physical limitations, both in the available mask making process as well as the fact that all mask elements must have a transmission magnitude less than or equal to unity, will undoubtedly prevent a perfect reproduction in photoresist of a mask structure. The present method takes these limitations into account by properly mapping the desired transmission function values to the closest physically achievable transmission values in the available mask making process. (More specifically, if the masks being considered have only conventional "chrome on glass" capability, then the only transmission function values available will be unity and zero; phase shift mask (PSM) technology offers a broader range of transmission values, with, of course, all PSM technologies physically restricted to producing phase shift masks with the magnitudes of transmission values being greater or equal to zero, and less or equal to unity, and with a phase between 0 and 360 degrees.) In this way one can achieve the best reproduction of the mask structures in the photoresist, given the physical limitations of the mask making process.

Continuing this simple example of our more general method, the multiplication of two modified 1D window functions gives a modified 2D function, i.e., S(x, y)=s(x;0,d) s(y;0,w)

Figure 7:
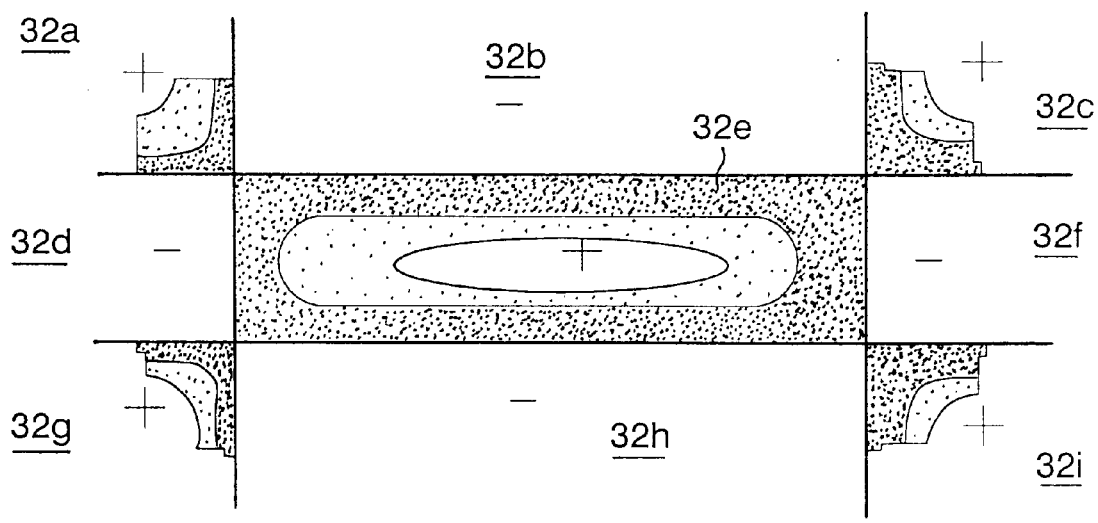
FIG. 7 illustrates a two-dimensional mask transmission function divided into nine regions, according to its sign.

With reference to FIG. 7, two horizontal lines y=0 and y=w and two vertical lines x=0 and x=d divide the 2D function S(x,y) into 3×3=9 regions 32a–32i. The central region and each of the 4 corner regions have a sign for the net modified transmission function that is positive (greater than zero), while the 4 other regions have a sign for the net modified transmission function that is negative (less than zero). When approaching.any of the boundaries between the positive and negative regions from a positive (negative) region, the value of S(x,y) function becomes very positive (negative).

Figure 8:
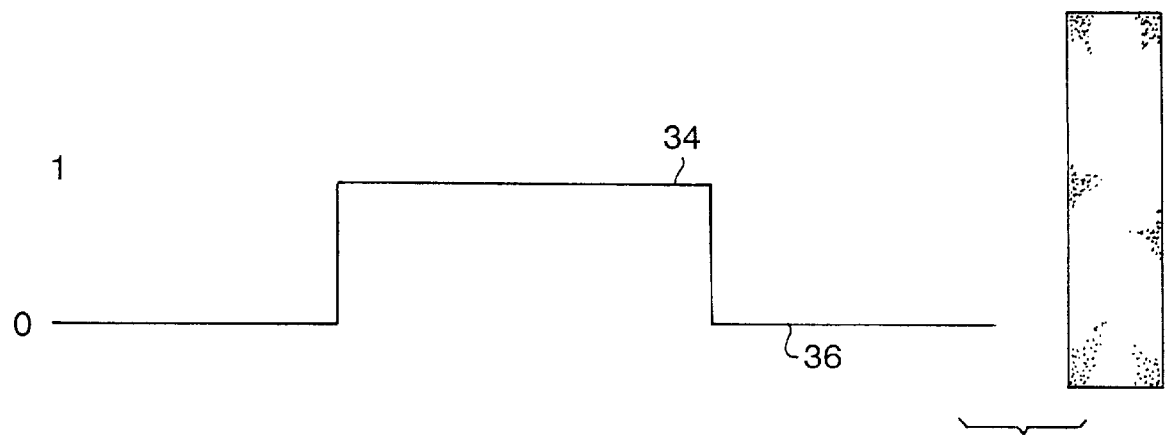
FIG. 8 schematically represents a mask mapped to two discrete values.
Figure 9:
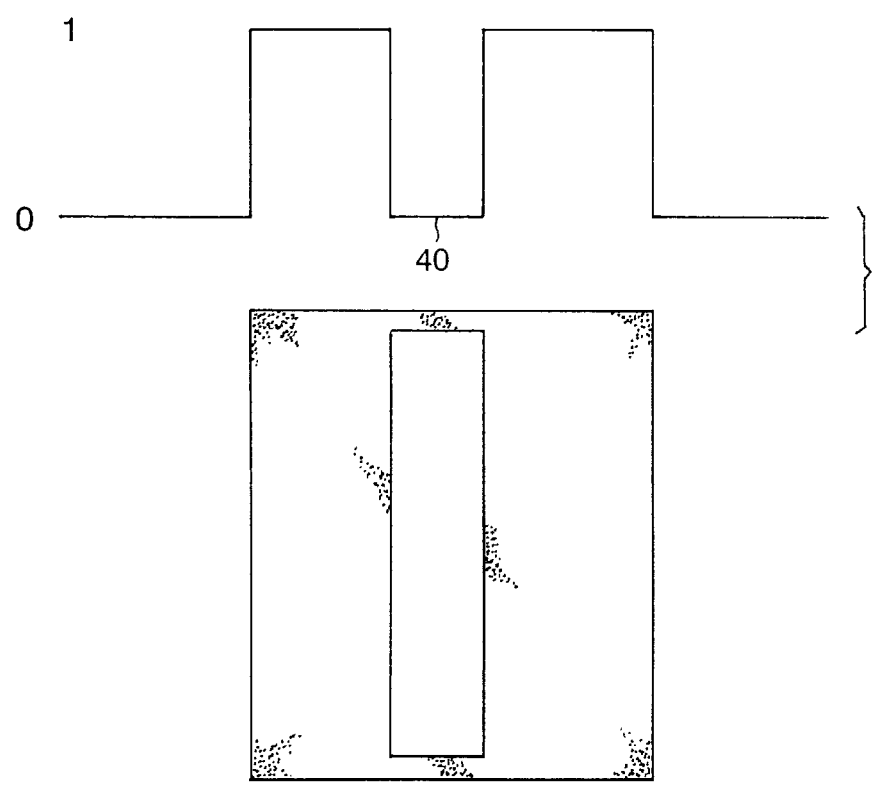
FIG. 9 schematically represents a mask having a hole in its middle mapped to two discrete values.
Figure 10:
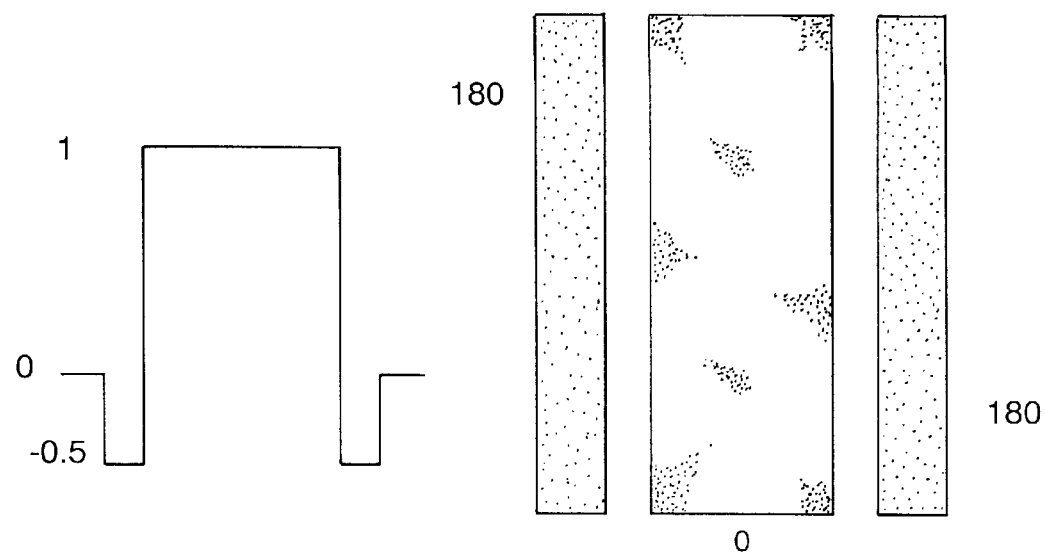
FIG. 10 schematically represents a phase shifting mask mapped to three discrete values.
Figure 11:
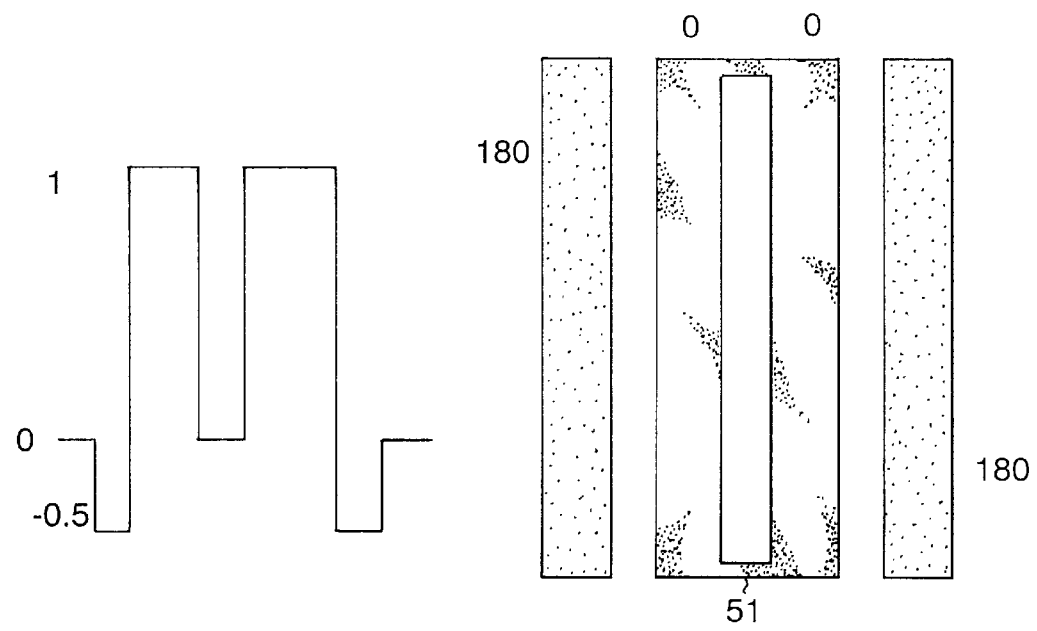
FIG. 11 schematically represents a phase shifting mask, having a gap in its center, mapped to three discrete values.

Assuming that a mask is made that only allows transmission of light with a value of unity or zero (i.e., clear or opaque, respectively), then as illustrated in FIGS. 8 and 9, the 2D function S(x,y) must be mapped to 2 discrete values. For a phase shifting mask, there would be a larger set of values that the idealized modified function S(x,y) could be mapped to, such as is illustrated in FIGS. 10 and 11. These figures show a mapping to 3 discrete values: 1,0 and −0.5, where the −0.5 value represents an attenuated phase shifting region with transmission amplitude 0.5, and with a phase contribution of 180 degrees. These values were chosen for illustrative purposes.

Figure 12:
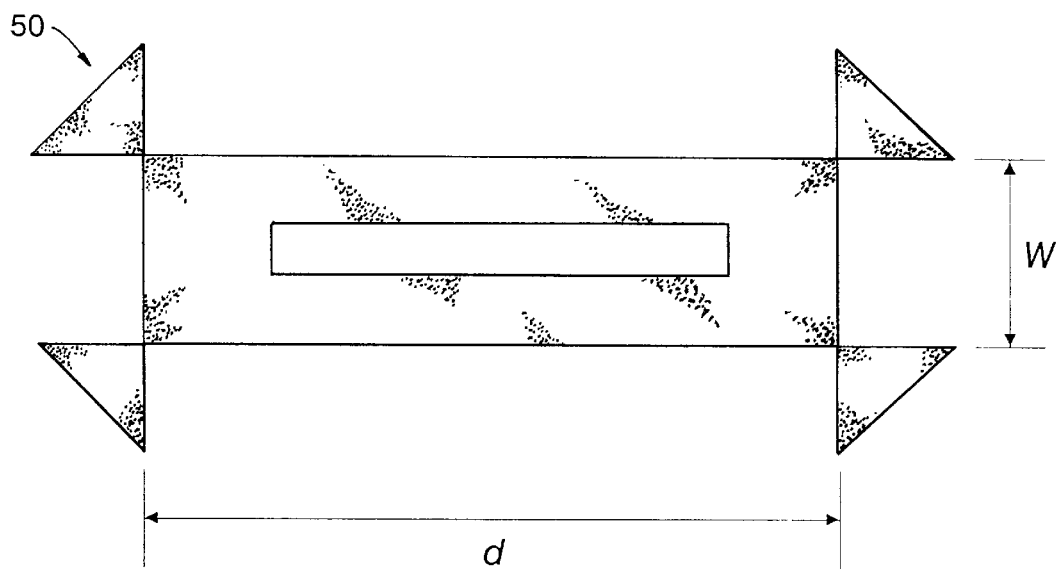
FIG. 12 shows a hanging triangle shape serif and an inner rectangular serif.
Figure 13:
FIG. 13 illustrates a square hanging serif.

To better explain our proposed mapping procedure, let $S_0$ be a "threshold" value, which is positive, $S_0 > 0$. For the case where two mask transmission values of unity and zero are allowed in the mask making process, then when $S(x, y) >= S_0$, $S(x, y)$ is mapped to value 1 as shown at 34; likewise, when $S(x, y) < S_0$, $S(x, y)$ is mapped to value 0 as shown at 36. After mapping, all 4 negative regions of $S(x, y)$ assume value 0. The central region usually becomes 1. When $S_0$ is large enough, the central part of the central region can become 0 as shown at 40. In terms of the 2D mask pattern being discussed here, the central part then becomes a hole in the middle of the rectangle, as indicated by 51 in FIG. 12. For each of the 4 corner regions, a right-angle triangular shape sub region becomes equal to 1 and the rest of the corner regions becomes equal to 0 in transmissivity. Thus, we have obtained a new serif design for printing a rectangular shaped pattern: it consists of the original rectangular mask plus 4 hanging serifs, all of transmissivity equal to unity, plus an inner rectangular opaque section (see FIG. 12). Each hanging serif lies outside the extension lines of a corner and is connected with the corner by a single point in the ideal case. This is significantly different from the usual serif design position and shape, which is typically based on the idea of compensating lost area directly. For manufacturability purposes, an approximation to this ideal case may be necessary; such as by connecting the hanging serif with a small connector, or by totally detaching the structure. The closer to the ideal structure, will yield the better reproduction of the intended design. Thus, to make the new design of hanging serif easier to implement for present mask making techniques, the triangle shape serif can be replaced by a square hanging serif, as illustrated at 52 in FIG. 13, which will give a reasonable approximation to the present proposed serif design.

In the example just described, the hanging serif that was deduced will in general yield an improvement in corner rounding and in foreshortening. However, the serif that was deduced can be improved upon further, as will be described next. In particular, one can use the proposed method to gain a good semi-empirical description of the overall microlithographic printing process, thereby aiding the optimization process of the determination of the serif structures. This semi-empirical process takes into account such physical factors as the wavelength of light used in an optical projection system, the numerical aperture, the partial coherence, the exposure, baking, and dissolution properties of the photoresist, and the etching characteristics of subsequent processes.

The following is a quantitative description of how to optimize the placement, shapes and size and transmission functions of serifs. For this purpose, the lithography process (including optical imaging processing and subsequent resist and etching processing) is modeled by a convolution or the square of a convolution. This model is very accurate for the aerial image (light intensity in the image space of the optical projection system) from complete spatially coherent illumination, since the aerial image in this case is given by the square of a convolution. This model is also very accurate for the aerial image due to spatially incoherent illumination, since the aerial image in this case is given by a convolution. Moreover, in this case, the subsequent resist process can also be modeled by another convolution which approximates the baking and dissolution steps involved. The two convolutions can be combined into a single convolution with an effective kernel function which has a bigger range radius r.

Thus, our proposed method makes use of a convolution model to predict the printed structures that would arise from a given mask used in a photolithographic process. This convolution model is extremely accurate under the conditions just described, and is approximately correct for other cases, such as for partially incoherent illumination. The convolution function needs to be characterized, which can be done by processing a mask with a measured set of openings, running a controlled process of imaging, exposure, baking, dissolution, and etch, measuring the final patterned structures, and then adjusting the convolution appropriately with the mask input, to yield the closest possible agreement to the measured structures. By so doing, the empirical model can then be used as a reasonably accurate representation of the lithographic process.

Based on a convolution model in which the kernel function has a range r (assuming circular aperture, thus the kernel function is angle independent), all nearby points within a circle of radius r may contribute to effecting the printability at the center of the circle. Usually, a point closer to the center contributes more than a point far away from the center. The optimization is done in the coordinate space.

Assuming a circular aperture, or at least a circularly symmetric illumination aperture, then one can show that the kernel function must be angle independent. However, this assumption of circular symmetry in the convolution process is not essential for our proposed method, although it certainly simplifies the application of the method. (For example, the illumination scheme can include the case of a square-shaped kernel function as will be discussed in the following).

Figure 14:
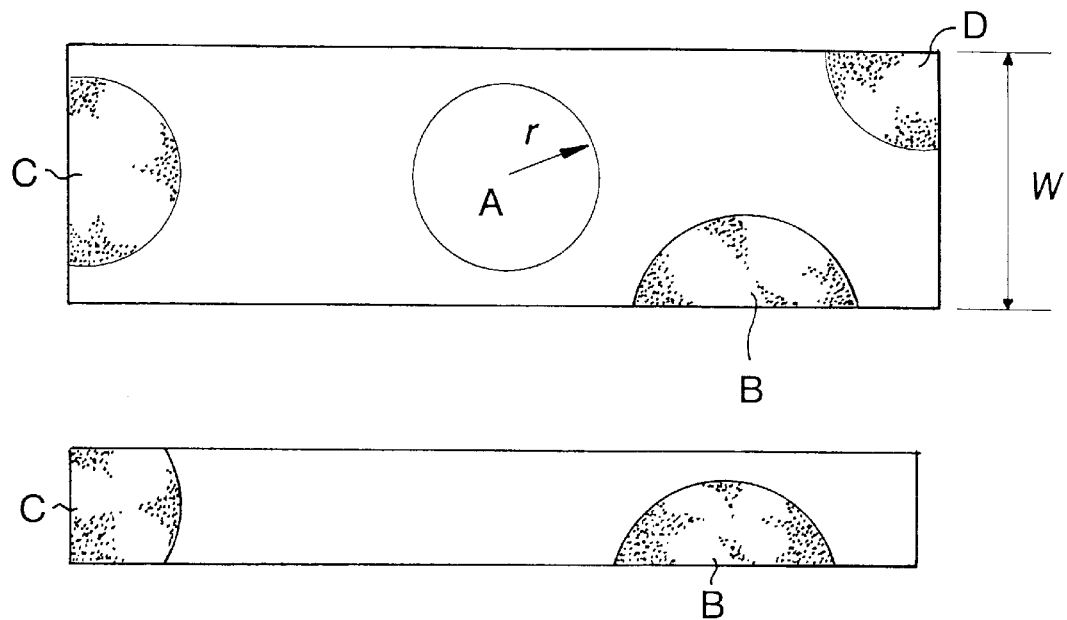
FIG. 14 demonstrates the geometrical reasoning behind corner rounding and foreshortening due to optical proximity effects.

With reference to FIG. 14, without any serif the following conditions hold: A) When r>0, there exists corner rounding since the convolution process, which the microlithographic process approximately follows, will result in sharp corners on the original mask structure becoming rounded. If one thinks about this from the point of view of the aerial image, the light intensity at a corner D ($I_D$) is less than that at the middle point C of a short edge, $I_D < I_C$ (Assume that light passes inside rectangle. See the diagram at the top of FIG. 14). B) When $0 < r \leq w/2$ (w is the width of a rectangular shape mask), there exist corner rounding but no line end foreshortening. Again, from the point of view of an aerial image, which may be the easiest way to picture the following, then by symmetry one would have that, $I_D = I_C/2 < I_C = I_B = I_A/2$. C) When r<w/2, line end shortening starts to appear, since $I_c > I_B$.

Figure 15:
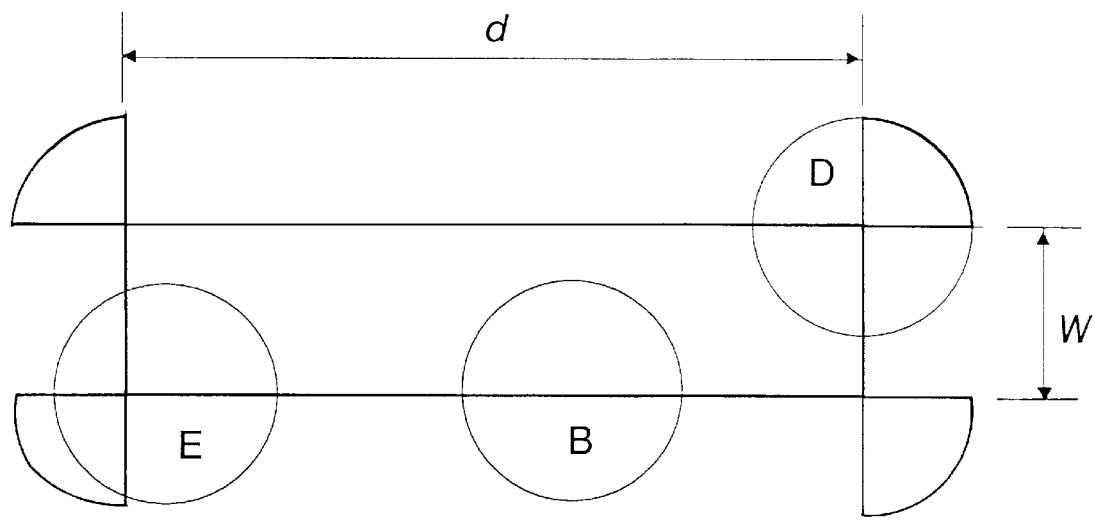
FIG. 15 shows a quarter circle hanging serifs.

With reference to FIG. 15, with the hanging serifs possessing the shape of a ¼ circle, the following holds. When the radius of the quarter circle equals the kernel function's range radius r and when $0 < r \leq w$, it is easy to show geometrically that (see FIG. 15) $I_B = I_C = I_D = I_E$ where point E is an arbitrary edge point near a corner. In other words, the above equalities show that corner rounding (and line end shortening if r>w/2) is corrected exactly. This exact correction is independent of the specific form of the kernel function in the radial direction, and the only assumption about the kernel function is that it has no angular dependency.

When the domain of the kernel is a square of half side length r, a square hanging serif of size r×r will make $I_B=I_C=I_D=I_E$ if the contribution from each quarter of the square kernel function is the same, as can be understood by following the same geometrical reasoning as existed for the case of an angular independent kernel function. Thus, in this case also, the corner rounding and foreshortening, if exist, are also corrected exactly, since $I_B=I_C=I_D=I_E$.

When r>w, which is the regime where the greatest amount of corner rounding and foreshortening will occur, the above simple design no longer works exactly, and the outer boundary of the serif can be optimized for different convolution functions.

For certain kernel functions, some predicted serif features via this method may become printable. To avoid this overcorrection, the serif sizes must be constrained to be less than r. In this case a compromise must be made between the aims of fully correcting for corner rounding and not printing the serif features that are introduced.

Figure 16:
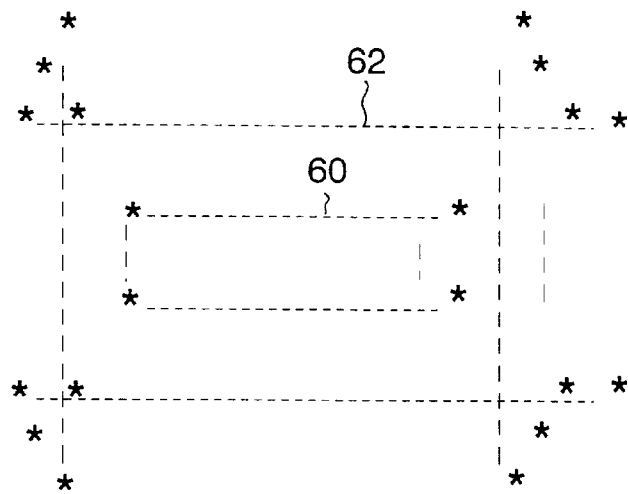
FIG. 16 shows an elbow shape mask with a hanging quarter circle region added to the outer corner and a quarter circle region taken out of the inner corner of the elbow.

For a rectangular mask opening, images onto negative resist, or a rectangular opaque region on a clear mask imaged onto positive resist, then a rectangular resist pattern will in general be formed, with rounded corners and a shortened length. The triangular and half circle serifs earlier were the corrections that improve the printability for these "outer corners". Above these corners for a rectangular mask pattern result in a printed structure with less area in the final resist pattern than in the original mask shape. In contrast, for the "inner corners" in an elbow shape mask, as shown in FIG. 16, instead of having the corners losing area in the printed structure, these types of corners typically gain in area, as they print with a roundness that lies outside the original elbow, as shown by the dotted line 64 in FIG. 16. To make the inner corner sharp, a ¼ circle region is removed just inside the elbow shape mask, as shown at 65 in FIG. 16. The radius of the ¼ circle equals the radius of the kernel function's range r. With this serif, the elbow will indeed print with a right angle. Again, corner rounding at both outer and inner corners can be corrected exactly if the ratio r/w is not too large.

For a 90 degree wire line turn, a serif (hole) of 90-degree-fan shape is used for correcting outer and inner corner rounding in the printed shapes, as shown as 66 and 65, respectively, in FIG. 16.

The above discussion shows intuitively (by geometrical proofs) that the method disclosed herein works exactly for the above ideal cases of 10 perfectly coherent illumination or 2) incoherent illumination combined with etch and resist developed processes that are convolution based (such as arises from a simple diffusion process). These quantitative results can be shown to be approximately correct also in the case of partially coherent illumination.

To specify the proposed method of deducing serif structures more precisely, one first needs to obtain a convolution based model that is calibrated to describe the lithographic printing process. The calibration can be done experimentally on a set of test mask structures. The convolution model will hold exactly in the idealized cases mentioned earlier, and approximately in more general circumstances; the calibration will enable the model to predict the printing as accurately as possible within the confines of this model, which we have found to be a fairly accurate one. Next one needs to add or subtract serif structures in order to add in the higher spatial frequency components if the mask pattern that are essentially lost during the imaging, exposure, dissolution, and etching process. Examples were discussed that illustrated this procedure. Due to the limitations in the mask making process, the required (modified) mask structure to produce the desired printed pattern must be mapped to those values of transmissivity that can be made in the given mask making process. For example, if only clear and opaque mask regions are allowed, then one needs to map the modified mask function to regions of unity and zero. If instead (1) clear regions of 0 degrees in phase, (2) opaque regions, and (3) clear regions with 180 degrees are allowed, then the modified mask function must be mapped to the transmissivity values of 1, 0, and −1 respectively. Other such mappings should be clear from these examples. These mappings are what produce the unique serif feature shapes that have been described here. Geometrical demonstrations have been discussed that show that these serif features will indeed yield the desired effect of producing the intended printed patterns, without corner rounding and foreshortening.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

Having thus described our invention, what we claim as new, and desire to secure by Letters Patent is:

1. A method of modeling a lithographic printing process with the use of a convolution function that has been matched or fitted to experimented data or to other existing models, comprising the steps of deducing a modified mask transmission function to enable the printability of the desired pattern, and mapping transmissivity values allowed in a mask making process to the modified mask transmission function to identify serif or subresolution structures.

2. A method according to claim 1, wherein the serif structure is selected from the group of shapes consisting of: a square, a rectangle, a quarter circle, a triangle, and a polygon.

3. A method for designing a mask for photolithography, comprising the steps of:
   providing a mask pattern used for imaging a source of light onto a surface, where subsequent steps of exposure of a photoresist material, followed by processing steps are used to obtain a final printed structure, wherein this process introduces distortions in the resulting printed structure from the intended design; and
   adding a serif or subresolution design to a rectilinear mask design to compensate for the distortions caused by the mask and the lithographic processing steps, and wherein
   some optimized serif and subresolution designs will lie completely outside the original pattern and each serif will be connected to the mask only at one of the corners.

4. A method according to claim 3, wherein the serif design is selected from the group of shapes consisting of: a square, a rectangle, a quarter circle, a triangle, and a polygon.

5. A method according to claim 3, wherein each serif design is connected to, and is outside the extension lines of, a respective one of the corners.

6. A method according to claim 3, wherein the mask is for use in an imaging system having a specific numerical aperture, and further including the step of choosing the size of the serif and subresolution design as a function of said numerical aperture; and wherein these serif and subresolution designs are functions of illumination design processing conditions.

7. A method according to claim 3, wherein the mask is for use in a lithography procedure in which a radiation beam having a specific wavelength, is transmitted through the mask, and further including the step of choosing the size of the serif and subresolution design as a function of said wavelength.

8. A method according to claim 3, wherein the mask structure has a width w, and the serif design has the shape of a quarter circle having a radius r of size dictated by resolution limit criteria, which is proportional to said wavelength and inversely proportional to said numerical aperture.

9. A method according to claim 3, wherein the mask structure has a width w, and the serif design has a square shape, and each side of the square shape has a half length r of size dictated by resolution limit criteria, which is proportional to said wavelength and inversely proportional to said numerical aperture.

10. A method according to claim 3, further including the step of providing the mask with an interior sub-resolution shape, including general two-dimensional shapes with rounded corners.

11. A photolithography mask comprising:
    a mask for transmitting a radiation beam with a pattern onto a surface, wherein the mask and lithographic processing steps causes distortions in said pattern; and
    group of serif designs connected to the mask to compensate for the distortions caused by the mask and the lithographic processing steps in said pattern; and
    wherein each serif and subresolution design is completely outside the mask and is connected to the mask.

12. A photolithography mask according to claim 11, wherein the serif design is selected from the group of shapes consisting of: a square, a rectangle, a quarter circle, a triangle and a polygon.

13. A photolithography mask according to claim 11, wherein each serif design is connected to, and is outside the extension lines of, the mask.

14. A photolithography mask according to claim 11, wherein:
    the mask is for use in an imaging system having a specific numerical aperture, and
    the size of the serif design is a function of said numerical aperture; and wherein these serif and subresolution designs are functions of illumination design and processing conditions.

15. A photolithography mask according to claim 11, wherein:
    the mask is for use in a lithography procedure in which a radiation beam having a specific wavelength is transmitted through the mask, and the size of the serif design is a function of said wavelength.

16. A photolithography mask according to claim 11, wherein the mask has a width w, and the serif design has the shape of a quarter circle having a radius r of size dictated by resolution limit criteria.

17. A photolithography mask according to claim 11, wherein the mask structure has a width w, and the serif design has a square shape, and each side of the square shape has a half length r of size dictated by resolution limit criteria.

18. A photolithography mask according to claim 11, wherein the mask includes an interior sub-resolution shape, including general two-dimensional shapes with rounded corners.

19. A photolithography mask according to claim 11, wherein the distortions in the pattern include corner rounding or foreshortening, and the serif designs compensate for the corner rounding or the foreshortening caused by the mask.

20. A method of modeling a lithographic printing process, comprising the steps:
    identifying a given mask to form a desired printed pattern in a photolithography printing process;
    identifying a convolution model, and using the convolution model to predict a printed structure that would result from a given mask in the photolithography process;
    identifying a modified mask pattern, from said predicted printed structure that can be used to form more accurately the desired printed pattern; and
    mapping transmittivity values allowed in a mask making process to the modified mask pattern to serif or subresolution structures needed to print the desired pattern.

21. A method according to claim 20, wherein the using step includes the steps of:
    processing a mask with a measured set of openings;
    running a controlled process to form a patterned structure;
    measuring the patterned structure; and
    adjusting the convolution with the mask input to yield closer agreement to the measured structure.

22. A method according to claim 21, wherein the step of identifying the mask pattern includes the step of adding the serif or subresolution structures to an original rectilinear mask design to compensate for distortion caused by said original mask and the lithographic processing steps; and
    the serif or subresolution structures are completely outside the original rectilinear mask design and are connected to the rectilinear design only at corners of the rectilinear design.

* * * * *

UNITED STATES PATENT AND TRADEMARK OFFICE
CERTIFICATE OF CORRECTION

PATENT NO. : 6,214,494 B1
DATED : April 10, 2001
INVENTOR(S) : O. Bula et al.

It is certified that error appears in the above-identified patent and that said Letters Patent is hereby corrected as shown below:

Column 1,
Line 44, "with, a" should read -- with a --

Column 3,
Lines 35 to 37, "FIG 16 shows an elbow shape mask with hanging quarter circle region added to the outer corner and a quarter circle region taken out of the inner corner of the elbow." should read -- FIG 16 illustrates a sub-resolution shape 60 in the center of a rectangular wire 62 --

Column 4,
Line 51, "s(y;0,w)" should read -- s(y;0,w). --

Figure 17:
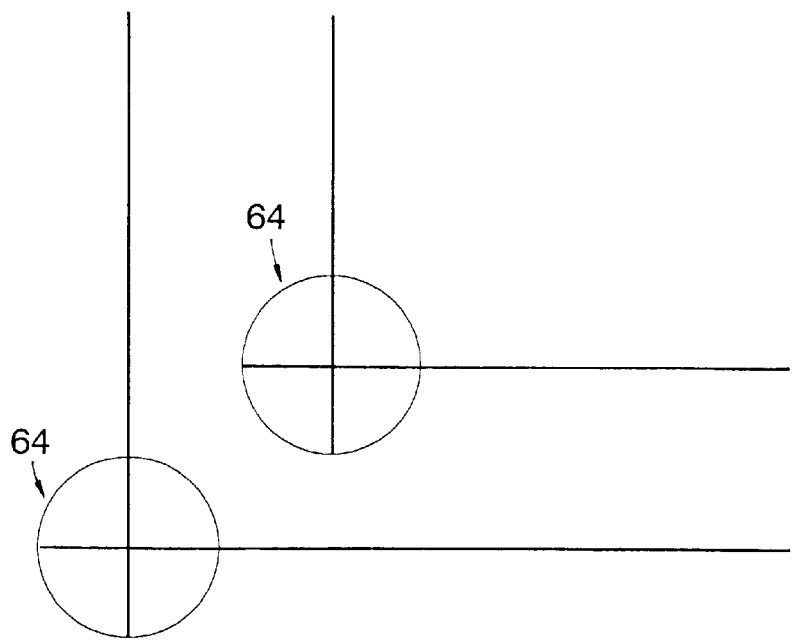
FIG. 17 shows an elbow shape mask with a hanging quarter circle region added to the outer corner and a quarter circle region taken out of the inner corner of the elbow.

Column 7,
Lines 17 and 18, insert -- For example, it is often desirable to have smaller serif when wire spacing is small. This may be achieved by including a sub-resolution shape 60 in the center of a rectangular wire 62. --
Lines 29, 32, and 34, "FIG 16" should read -- FIG 17 --

Signed and Sealed this

Nineteenth Day of March, 2002

JAMES E. ROGAN
*Director of the United States Patent and Trademark Office*

*Attest:*

*Attesting Officer*